United States Patent
Ma

(10) Patent No.: US 11,796,924 B2
(45) Date of Patent: Oct. 24, 2023

(54) METHOD FOR OVERLAY ERROR CORRECTION AND METHOD FOR MANUFACTURING A SEMICONDUCTOR DEVICE STRUCTURE WITH OVERLAY MARKS

(71) Applicant: NANYA TECHNOLOGY CORPORATION, New Taipei (TW)

(72) Inventor: Shih-Yuan Ma, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 162 days.

(21) Appl. No.: 17/568,118

(22) Filed: Jan. 4, 2022

(65) Prior Publication Data

US 2023/0213873 A1 Jul. 6, 2023

(51) Int. Cl.
*G03F 7/00* (2006.01)
*G03F 1/70* (2012.01)

(52) U.S. Cl.
CPC ............ *G03F 7/70633* (2013.01); *G03F 1/70* (2013.01)

(58) Field of Classification Search
CPC ................................ G03F 1/70; G03F 7/70633

USPC ..................................................... 430/5, 22
See application file for complete search history.

(56) References Cited

U.S. PATENT DOCUMENTS

2011/0033790 A1 2/2011 Mishima

FOREIGN PATENT DOCUMENTS

| CN | 102799060 A | 11/2012 |
| TW | I302348 B | 10/2008 |
| TW | 201712447 A | 4/2017 |
| TW | 202014672 A | 4/2020 |
| TW | 202034096 A | 9/2020 |
| TW | 202043750 A | 12/2020 |

*Primary Examiner* — Christopher G Young
(74) *Attorney, Agent, or Firm* — Muncy, Geissler, Olds & Lowe

(57) ABSTRACT

A method for overlay error correction includes generating a first overlay error based on a first overlay mark, wherein the first overlay error is indicative of a misalignment between a lower pattern and an upper pattern of the first overlay mark. The method also includes generating a second overlay error based on a second overlay mark, in response to an abnormal of the first overlay error is detected. The method further includes determining whether the abnormal of the first overlay error is caused by the misalignment between the lower pattern and the upper pattern depending on the second overlay error.

13 Claims, 15 Drawing Sheets

METHOD FOR OVERLAY ERROR CORRECTION AND METHOD FOR MANUFACTURING A SEMICONDUCTOR DEVICE STRUCTURE WITH OVERLAY MARKS

TECHNICAL FIELD

The present disclosure relates to a method for overlay error correction and method for manufacturing a semiconductor device structure with overlay marks.

Discussion of the Background

As the semiconductor industry develops, reducing overlay errors in photoresist patterns and underlying patterns in lithography operations is becoming much more important. Since correctly measuring overlay errors has become more difficult due to various is factors such as asymmetric shapes of measurement structures, a new overlay mark and method which can more precisely measure overlay errors is required.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a mark for overlay correction. The mark includes a first pattern and a second pattern. The first pattern is disposed on a first surface of a substrate. The second pattern is disposed on a second surface of the substrate, opposite to the first surface of the substrate. The first pattern overlaps at least a portion of the second pattern, and the first pattern and the second pattern collaboratively define a first overlay error.

Another aspect of the present disclosure provides a mark for overlay correction. The mark includes a first overlay mark and a second overlay mark. The first overlay mark includes a first pattern and a second pattern disposed on a first surface of a substrate. The first overlay mark is utilized to generate a first overlay error. The second overlay mark includes a third pattern disposed on a second surface of the substrate and a fourth pattern disposed on the first surface of the substrate. The first surface of the substrate is opposite to the second surface of the substrate. The second overlay mark is utilized to generate a second overlay error, and the second overlay mark is utilized to correct the first overlay error.

Another aspect of the present disclosure provides a method for overlay error correction. The method includes generating a first overlay error based on a first overlay mark, wherein the first overlay error is indicative of misalignment of a lower pattern and an upper pattern of the first overlay mark, and, in response to detection of abnormality in the first overlay error, generating a second overlay error based on a second overlay mark, and determining whether the abnormality in the first overlay error is caused by the misalignment of the lower pattern and the upper pattern depending on the second overlay error.

Another aspect of the present disclosure provides a method for manufacturing a semiconductor device structure. The method includes providing a substrate having a first surface and a second surface opposite thereto, forming a first pattern on the first surface of the substrate, forming a second pattern on the second surface of the substrate, forming an intermediate structure covering the second pattern, forming a third pattern on the second surface of the substrate, wherein the second pattern and the third pattern collaboratively define a first overlay error, and forming a fourth pattern on the second surface of the substrate, wherein the first pattern and the fourth pattern collaboratively define a second overlay error.

The embodiments of the present disclosure provide overlay marks for overlay error measurement. Two overlay marks can be collaboratively utilized to determine whether an abnormality in an overlay error is caused by the misalignment of a current layer and a pre-layer, or by wafer warpage. Using two measurement steps for two overlay marks, inaccurate adjustment of exposure equipment can be prevented. Accordingly, the available time of the exposure equipment can be enhanced.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers Referring to similar elements throughout the Figures, and:

DETAILED DESCRIPTION

Figure 1:
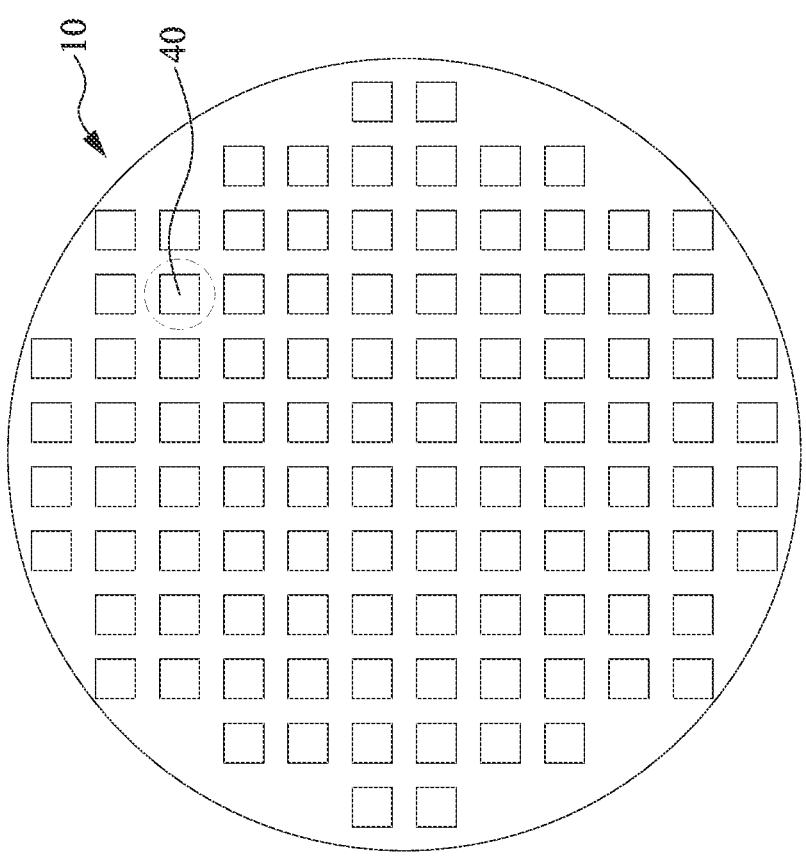
FIG. 1 is a top view of a wafer, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
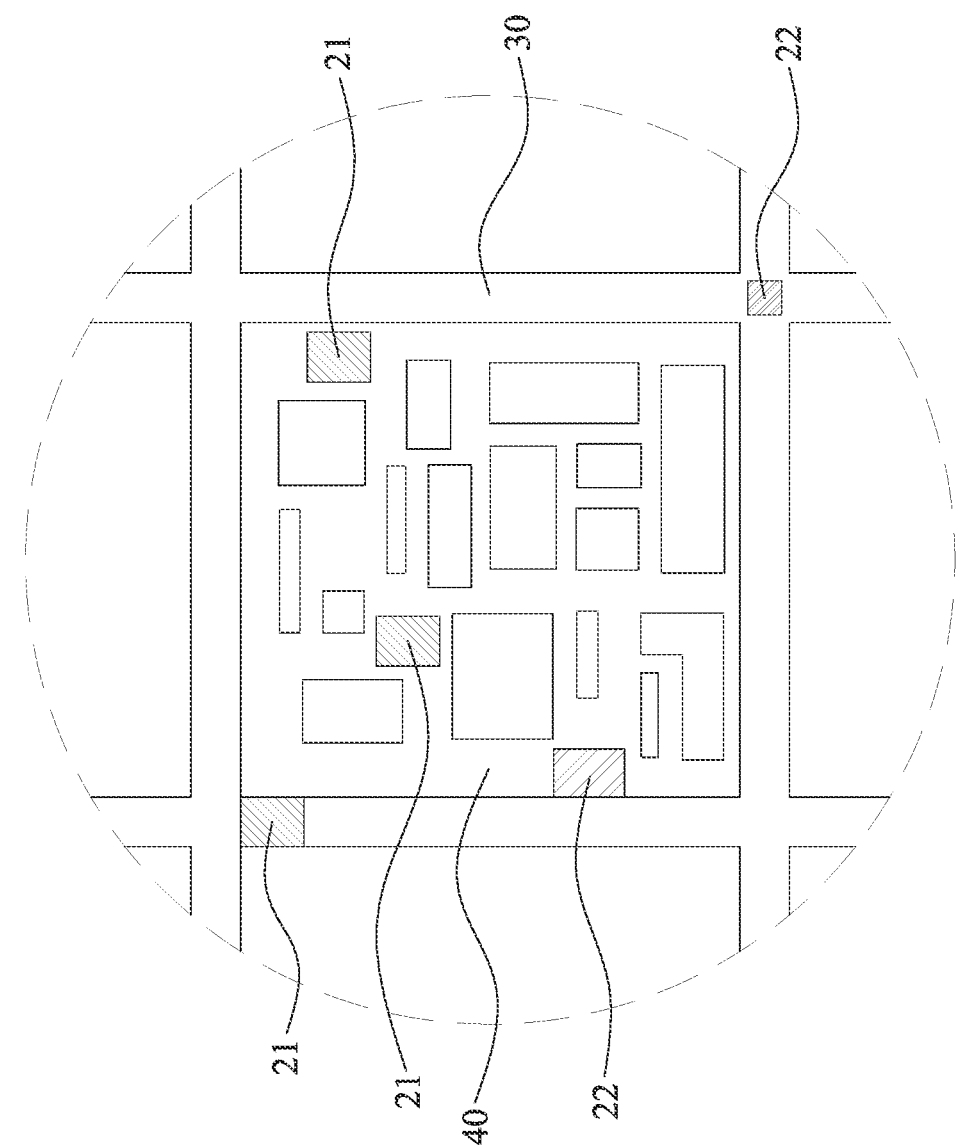
FIG. 2 is an enlargement view of a dotted region as shown in FIG. 1, in accordance with some embodiments of the present disclosure.

FIG. 1 is a top view of a wafer 10 according to various aspects of the present disclosure, and FIG. 2 is a top view of the enlargement of a dotted region in FIG. 1.

As shown in FIG. 1 and FIG. 2, the wafer 10 is sawed along scribe lines 30 into a plurality of dies 40. Each of the dies 40 may include semiconductor devices, which can include active and/or passive components. The active component may include a memory die (e.g., dynamic random access memory (DRAM) die, a static random access memory (SRAM) die, etc.), a power management die (e.g., power management integrated circuit (PMIC) die), a logic die (e.g., system-on-a-chip (SoC), central processing unit (CPU), graphics processing unit (GPU), application processor (AP), microcontroller, etc.), a radio frequency (RF) die, a sensor die, a micro-electro-mechanical-system (MEMS) die, a signal processing die (e.g., digital signal processing (DSP) die), a front-end die (e.g., analog front-end (AFE) dies) or other active components. The passive component may include a capacitor, a resistor, an inductor, a fuse or other passive components.

As shown in FIG. 2, overlay marks 21 and 22 can be disposed on the wafer 10. In some embodiments, the overlay mark 21 or 22 can be located on the scribe lines 30. The overlay mark 21 or 22 can be disposed at the corner of an edge of each of the dies 40. In some embodiments, the overlay mark 21 or 22 can be located inside the die 40. In some embodiments, the overlay mark 21 can be utilized to measure whether the current layer, such as an opening of a photoresist layer, is precisely aligned with a pre-layer in the semiconductor fabrication process. In some embodiments, the overlay mark 21 can be utilized to generate a first overlay error between a current layer (or an upper layer) and a pre-layer (or a lower layer). In some embodiments, the overlay mark 22 can be utilized to generate a second overlay between two patterns (e.g., a current pattern and a reference pattern) on two opposite sides of the wafer 10. In some embodiments, the overlay mark 22 can be utilized to correct the first overlay error generated from the overlay mark 21. In some embodiments, the overlay mark 22 can be utilized to determine whether an abnormality (or an abnormal) in the first overlay error generated from the overlay mark 21 is caused by misalignment of the current layer and the pre-layer. In some embodiments, the overlay mark 22 can be utilized to determine whether an abnormality in the first overlay error is caused by warpage of the wafer. In some embodiments, the overlay marks 21 and 22 can be collaboratively utilized to determine a degree of warpage of the wafer 10. In some embodiments, the overlay marks 21 and 22 can be collaboratively utilized to determine whether an abnormality in the first overlay error generated from the overlay mark 21 is caused by warpage of the wafer 10.

Figure 3:
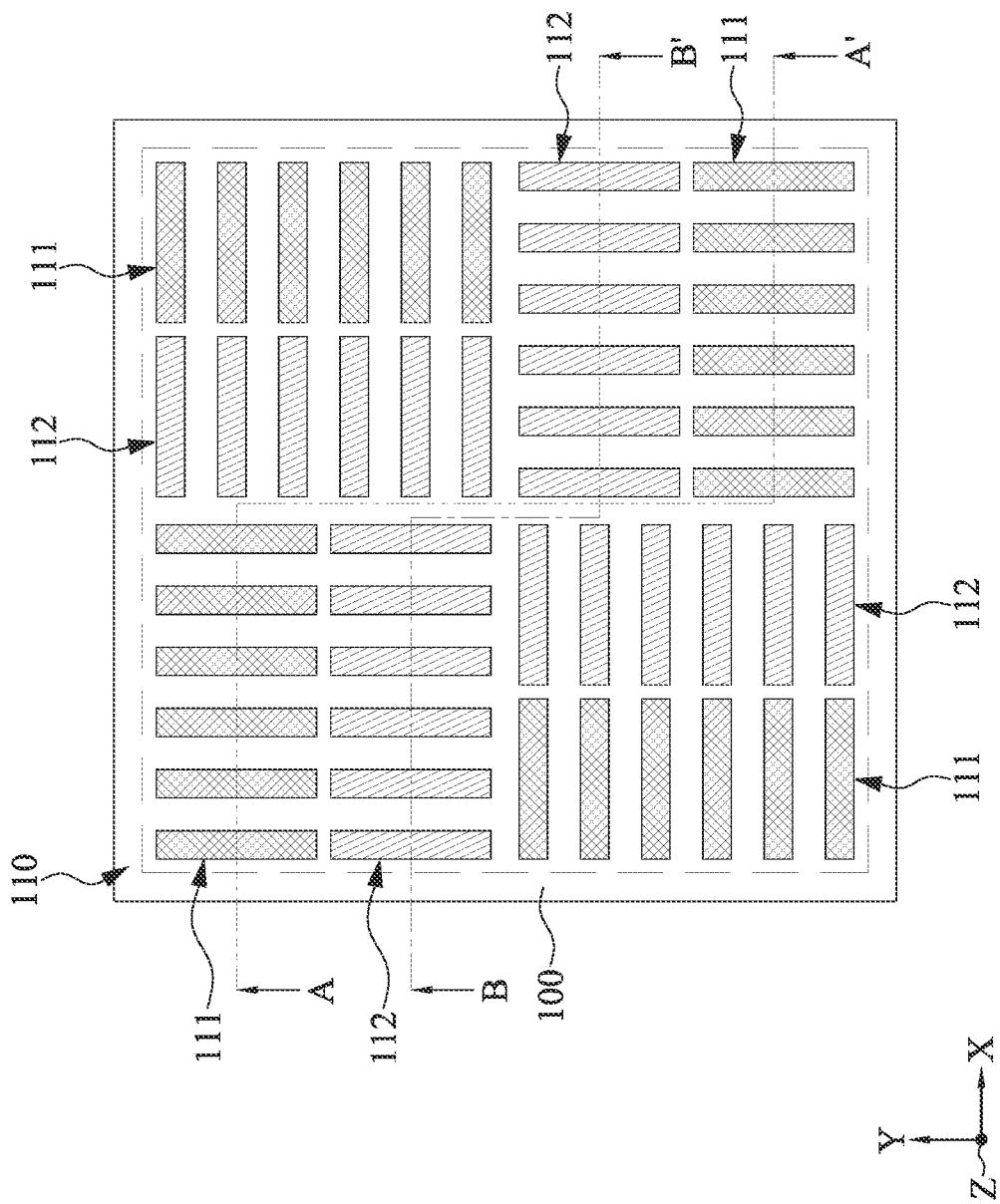
FIG. 3 is a top view of an overlay mark, in accordance with some embodiments of the present disclosure.

FIG. 3 is a top view of an overlay mark 110 for aligning different layers over a substrate 100 according to various aspects of the present disclosure. As shown in FIG. 3, a semiconductor device structure, such as a wafer, can include the overlay mark 110 over the substrate 100. In some embodiments, the overlay mark 21 shown in FIG. 2 can include a pattern or structure similar to or the same as that of the overlay mark 110 in FIG. 3.

The substrate 100 may be a semiconductor substrate, such as a bulk semiconductor, a semiconductor-on-insulator (SOI) substrate, or the like. The substrate 100 can include an elementary semiconductor including silicon or germanium in a single crystal, polycrystalline, or amorphous form, a compound semiconductor material including at least one of silicon carbide, gallium arsenide, gallium phosphide, indium phosphide, indium arsenide, and indium antimonide, an alloy semiconductor material including at least one of SiGe, GaAsP, AlInAs, AlGaAs, GaInAs, GaInP, and GaInAsP, any other suitable materials, or combination thereof. In some embodiments, the alloy semiconductor substrate may be a SiGe alloy with a gradient Ge feature in which the Si and Ge composition changes ratio with location of the gradient SiGe feature. In another embodiment, the SiGe alloy is formed over a silicon substrate. In some embodiments, a SiGe alloy can undergo mechanical strain from another material in contact with the SiGe alloy. In some embodiments, the substrate 100 may have a multilayer structure, or the substrate 100 may include a multilayer compound semiconductor structure.

The overlay mark 110 can include patterns 111 and patterns 112 over the substrate 100. The pattern 111 can be a pre-layer's pattern. The pattern 112 can be a current layer's pattern. The pre-layer (or a lower-layer) can be located at a horizontal level different from that of the current layer (or an upper-layer). Each of the patterns 111 (or patterns 112) can be located in one of four quadrature targets areas, two of which are utilized to measure the overlay error of the X direction, and two of which are utilized to measure the overlay error of the Y direction.

While measuring an overlay error using an overlay mark, such as the overlay mark 110, an X-directional deviation is measured along a straight line in an X direction of the overlay mark 110. A Y-directional deviation is further measured along a straight line in a Y direction of the overlay mark 110. One single overlay mark, including the patterns 111 and the patterns 112, can be used to measure one X- and one Y-directional deviation between two layers on a substrate. Therefore, whether the current layer and the pre-layer are precisely aligned can be determined according to the X- and Y-directional deviations. The overlay error may include the X-directional deviation ($\Delta X$), the Y-directional deviation ($\Delta Y$), or a combination of both.

Figure 3A:
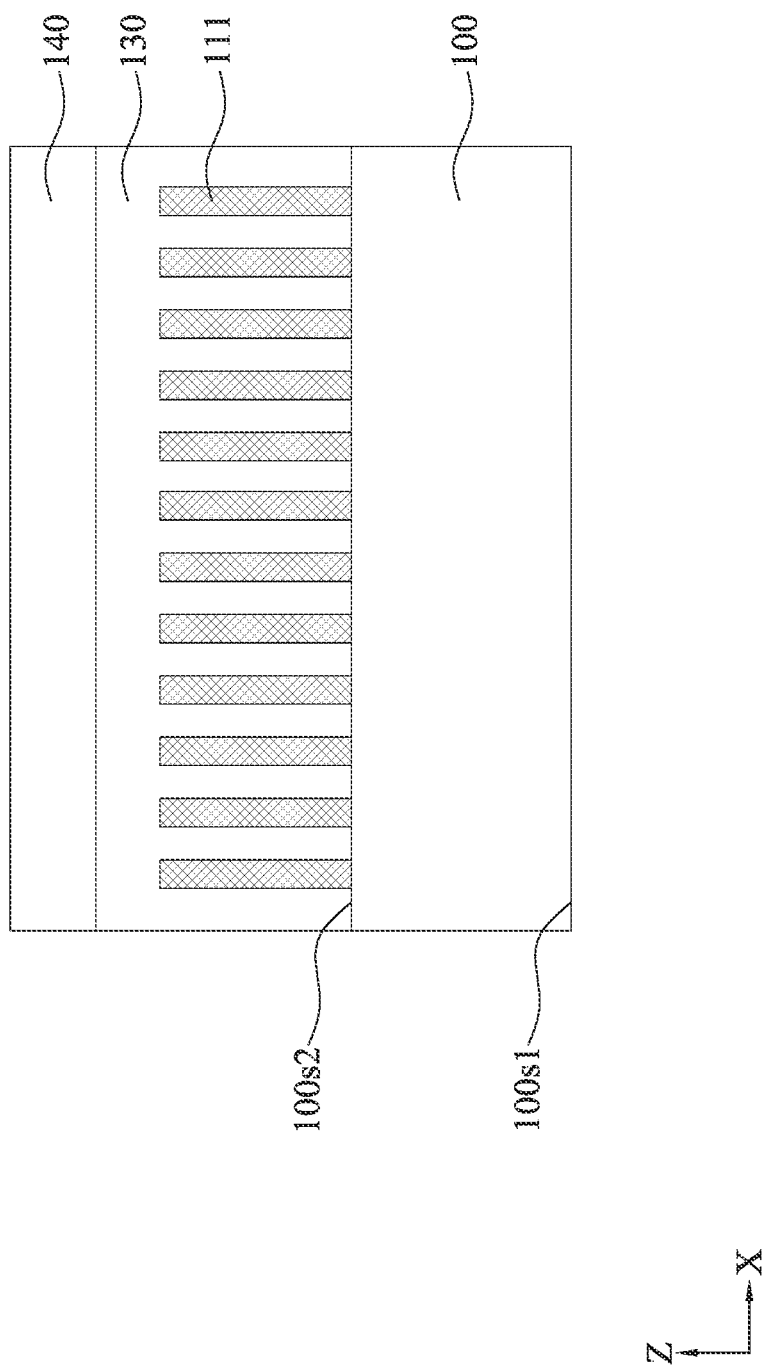
FIG. 3A is a cross-sectional view along line A-A' of FIG. 3, in accordance with some embodiments of the present disclosure.

FIG. 3A is a cross-sectional view taken along a cutting line A-A' of FIG. 3.

As shown in FIG. 3 and FIG. 3A, the substrate 100 can have a surface 100s1 and a surface 100s2 opposite to the surface 100s1. The surface 100s2 of the substrate 100 can be an active surface, on which input/output terminals are disposed. The surface 100s1 of the substrate 100 can be a backside surface. The pattern 111 can be disposed on the surface 100s1 of the substrate 100. The pattern ill can be disposed within or below an intermediate structure 130. In some embodiments, the pattern 111 may include the same material as an isolation structure.

In some embodiments, the pattern 111 may be disposed at the same elevation as the isolation structure. The isolation structure can include, for example, a shallow trench isolation (STI), a field oxide (FOX), a local-oxidation of silicon (LOCOS) feature, and/or other suitable isolation element. The isolation structure can include a dielectric material such as silicon oxide, silicon nitride, silicon oxy-nitride, fluoride-doped silicate (FSG), a low-k dielectric material, combinations thereof, and/or other suitable material.

In some embodiments, the pattern 111 can include the same material as a gate structure. The gate structure can be sacrificial, for example, a dummy gate structure. In some embodiments, the pattern 111 can be disposed at the same elevation as the gate structure. In some embodiments, the pattern 111 can include a dielectric layer of the same material as a gate dielectric layer and a conductive layer of the same material as a gate electrode layer.

In some embodiments, the gate dielectric layer can include silicon oxide ($SiO_x$), silicon nitride ($Si_xN_x$), silicon oxynitride (SiON), or a combination thereof. In some embodiments, the gate dielectric layer can include dielectric material(s), such as high-k dielectric rmaterial. The high-k dielectric material may have a dielectric constant (k value) greater than 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of the disclosure.

In some embodiments, the gate electrode layer can include a polysilicon layer. In some embodiments, the gate electrode layer can be made of conductive material, such as aluminum (Al), copper (Cu), tungsten (W), titanium (Ti), tantalum (Ta), or other applicable materials. In some embodiments, the gate electrode layer can include a work function layer. The work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof. Other suitable materials are within the contemplated scope of the disclosure. The gate electrode layer can be formed by low-pressure chemical vapor deposition (LPCVD) and plasma-enhanced CVD (PECVD)).

In some embodiments, the pattern 111 can include the same material as a conductive via, which can be disposed on a conductive trace, such as the first metal layer (M1 layer). In this embodiment, the pattern 111 can include a barrier layer and a conductive layer surrounded by the barrier layer. The barrier layer can include metal nitride or other suitable materials. The conductive layer can include metal, such as W, Ta, Ti, Ni, Co, Hf, Ru, Zr, Zn, Fe, Sn, Al, Cu, Ag, Mo, Cr, alloy or other suitable materials. In this embodiment, the pattern 111 can be formed by suitable deposition processes such as, for example, sputtering or physical vapor deposition (PVD).

The intermediate structure 130 can include one or more intermediate layers made of insulating material, such as silicon oxide or silicon nitride. In some embodiments, the intermediate structure 130 can include conductive layers, such as metal layers or alloy layers. In some embodiments, the one or more intermediate layers can be formed by a suitable film firming method, such as chemical vapor deposition (CVD), atomic layer deposition (ALD), or physical vapor deposition (PVD). After the intermediate layers are formed, a thermal operation, such as rapid thermal annealing, can be performed. In other embodiments, a planarization operation, such as a chemical mechanical polishing (CMP) operation, is performed. In other embodiments, a removing operation, such as etching process, can be performed. The etching process can include, for example, a dry etching process or a wet etching process. It is understood that additional operations can be provided before, during, and after processes as set forth, and some of the operations described can be replaced or eliminated, for additional embodiments of the method. The order of the operations/processes may be interchangeable.

Figure 3B:
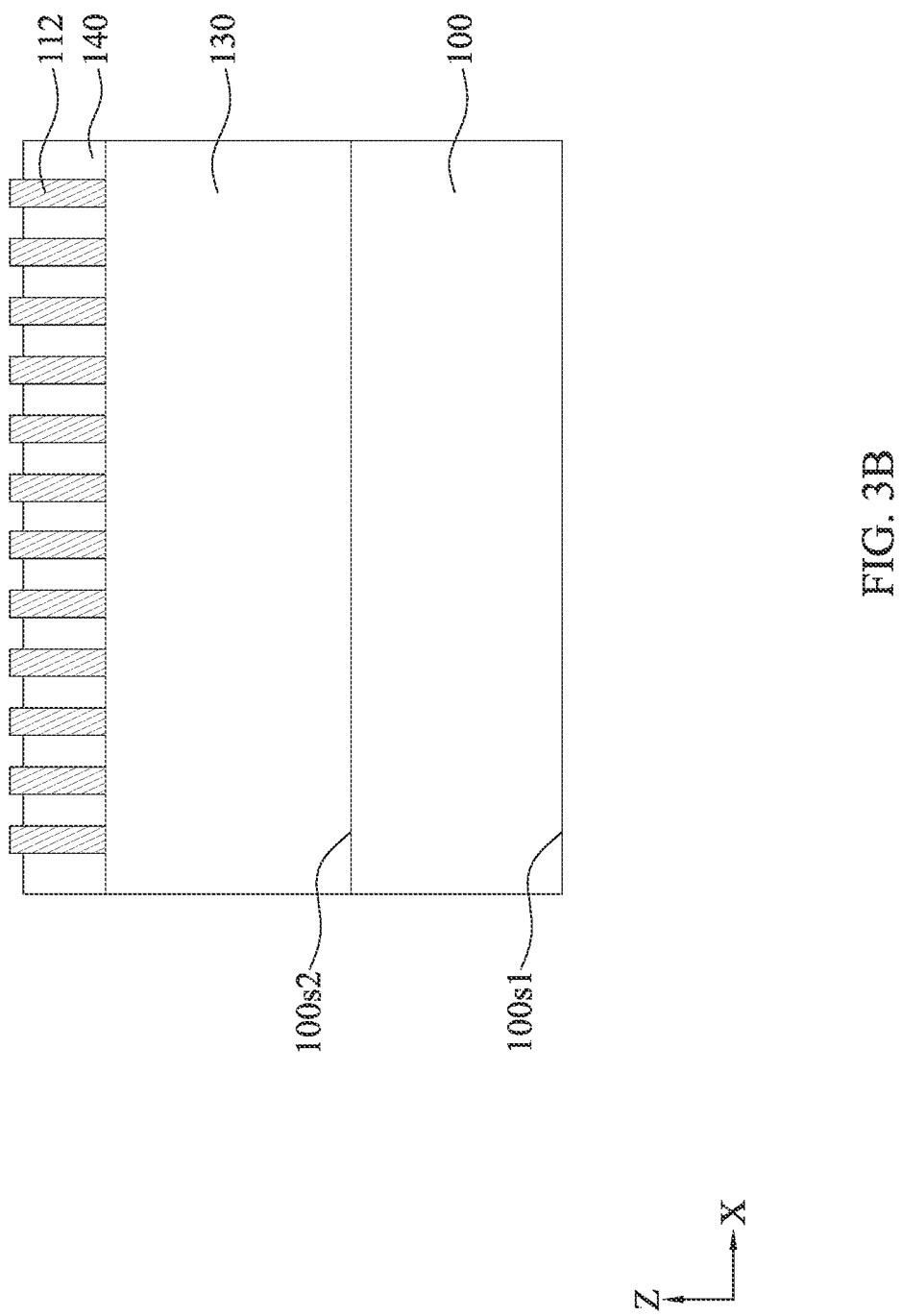
FIG. 3B is across-sectional view along line B-B' of FIG. 3, in accordance with some embodiments of the present disclosure.

FIG. 3B is a cross-sectional view taken along a cutting line B-B' of FIG. 3.

As shown in FIG. 3 and FIG. 3B, the pattern 112 is disposed on the intermediate structure 130. The pattern 112 can be disposed on or over the surface 100s2 of the substrate 100. In some embodiments, the pattern 112 can be a plurality of openings defined by a mask 140. The mask 140 can be formed on the intermediate structure 130, and will be removed in subsequent process. The mask 140 can include a positive-tone or negative-tone photoresist such as polymer, or a hard mask such as silicon nitride or silicon oxy-nitride. The current layer, including the mask 140 and the patterns 112, can be patterned using suitable photolithography such as, for example, forming a photoresist layer over the intermediate structure 130, exposing the photoresist layer to a pattern by a reticle, or baking and developing the photoresist to form the mask 140 and the patterns 112. The mask 140 may then be used to define a pattern into the intermediate structure 130 such that the portion of the intermediate structure 130 exposed by the photoresist layer can be removed.

Figure 4:
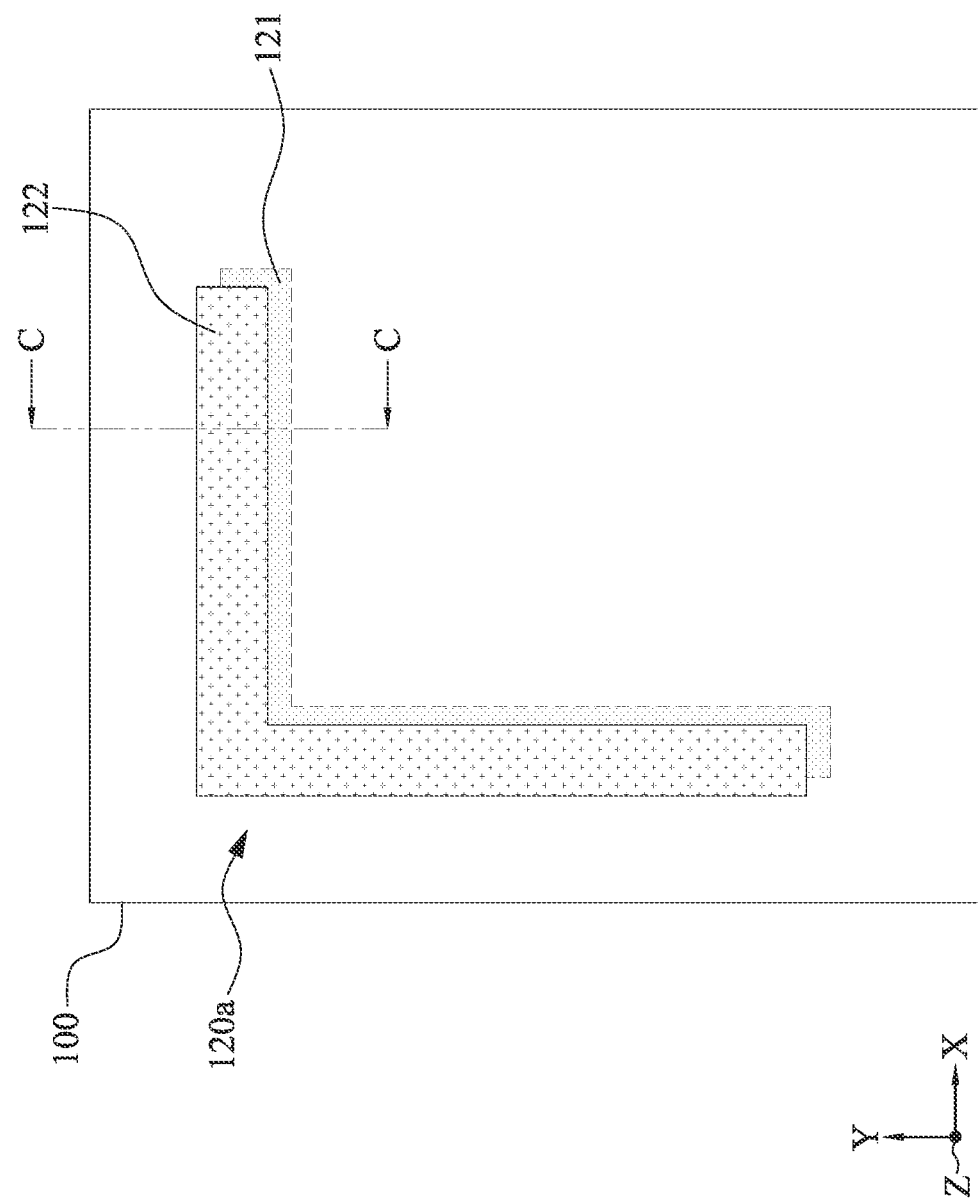
FIG. 4 is a top view of an overlay mark, in accordance with some embodiments of the present disclosure.

FIG. 4 is a top view of an overlay mark 120a, in accordance with some embodiments of the present disclosure. As shown in FIG. 4, a semiconductor device structure, such as a wafer, can include the overlay mark 120a over the substrate 100. In some embodiments, the overlay mark 22 shown in FIG. 2 can include a pattern or a structure similar to or the same as that of the overlay mark 120a shown in FIG. 4.

The overlay mark 120a can include patterns 121a and 122. In some embodiments, the patterns 121a and 122 can be disposed on two opposite surfaces of the substrate 100. In some embodiments, the profile of the pattern 121a and the profile of the pattern 122 are equiform, in a plan view. In some embodiments, the profile of the pattern 121a is symmetrical with the profile of the pattern 122 with respect to the XY plane. In some embodiments, the shape of the pattern 121a and the shape of the pattern 122 are substantially the same. In some embodiments, the size of the pattern 121a and the size of the pattern 122 are substantially the same. In some embodiments, the pattern 121a overlaps at least a portion of the pattern 122 along the Z direction. In some embodiments, each of the patterns 121a and 122 can be composed of a single continuous pattern. In some embodiments, the aforesaid single continuous pattern can have any profile or shape. In this embodiment, the pattern 121a can also be referred to as a reference pattern. In this disclosure, the term "equiform" can indicate that two patterns of the same size and/or shape.

While measuring an overlay error using an overlay mark, such as the overlay mark 120a, an X-directional deviation is measured along a straight line in an X direction of the overlay mark 120a. A Y-directional deviation is further measured along a straight line in a Y direction of the overlay mark overlay mark 120a. Therefore, whether the patterns 121a and 122 are precisely aligned can be determined according to the X- and Y-directional deviations. The overlay error can include the X-directional deviation (ΔX), the Y-directional deviation (ΔY), or a combination of both.

Figure 4A:
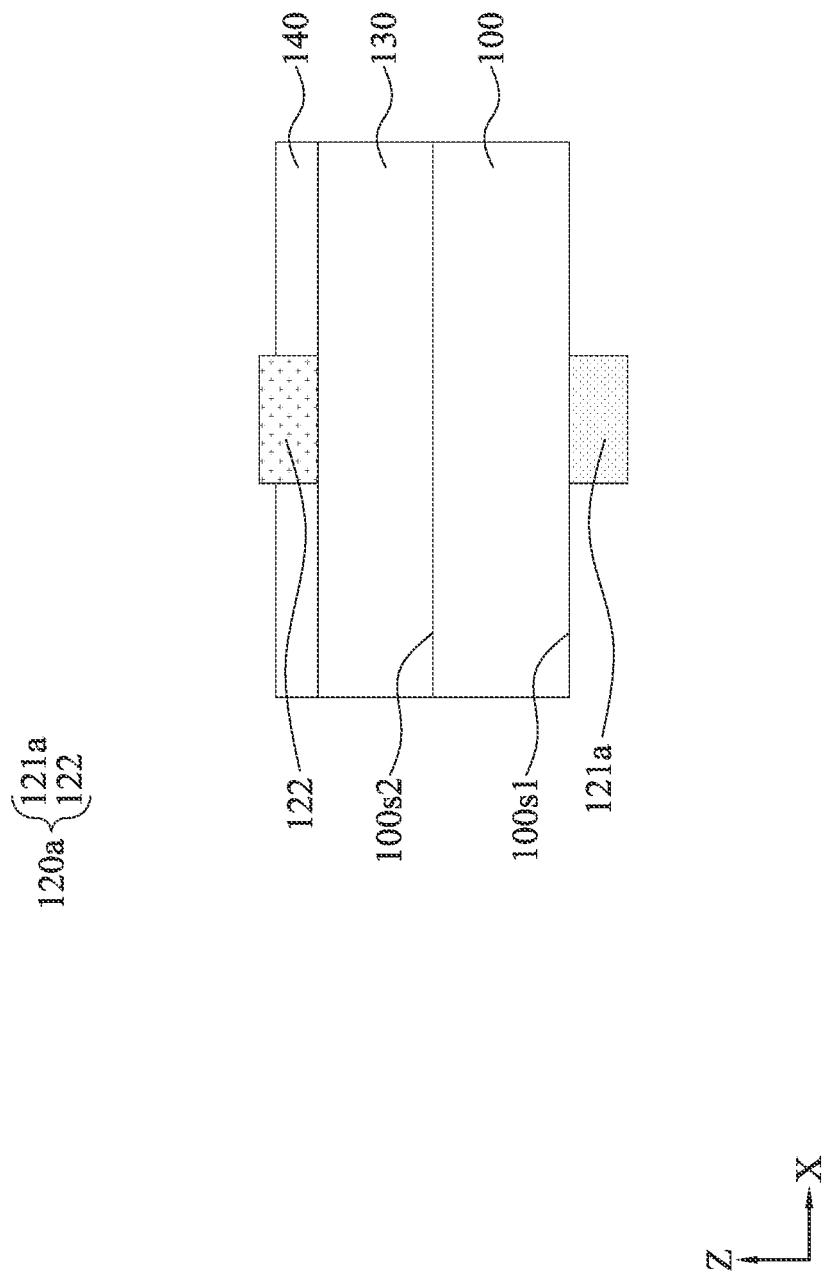
FIG. 4A is a cross-sectional view along line C-C' of FIG. 4, in accordance with some embodiments of the present disclosure.

FIG. 4A is a cross-sectional view along line C-C' of FIG. 4, in accordance with some embodiments of the present disclosure.

In some embodiments, the pattern 121a can be disposed on the surface 100s1 of the substrate 100. In some embodiments, the pattern 121a can include a layer, such as a dummy layer, protruding from the surface 100s1 of the substrate 100. In some embodiments, the material of the pattern 121a can include a polysilicon layer. In some embodiments, the pattern 121a can be made of metal, such as aluminum (Al), copper (Cu), tungsten (W), titanium (Ti), tantalum (Ta), or other applicable materials. The pattern 121a can be formed by LPCVD, PECVD, sputtering, or other suitable process. In some embodiments, the pattern 121a can include a material that can be distinguished from the material of the substrate 100 by an optical image. In some embodiments, the pattern 121a can include a material that can be distinguished from silicon oxide by an optical image.

In some embodiments, the pattern 122 can be disposed on or over the surface 100s2 of the substrate 100. In some embodiments, the pattern 122 can be disposed on the intermediate structure 130. In some embodiments, the pattern 122 can be an opening or a recess defined by the mask 140. The pattern 122 can be patterned using suitable photolithography such as, for example, forming a photoresist layer over the intermediate structure intermediate structure 130, exposing the photoresist layer to a pattern by a reticle, or baking and developing the photoresist to form the mask pattern 122. In some embodiments, the patterns 112 and 122 can be located at the same horizontal level. In some embodiments, the patterns 112 and 122 can be formed simultaneously. That is, the patterns 112 and 122 can be formed by the same process and formed by the same semiconductor fabrication equipment. In some embodiments, the profile of the pattern 122 can be different from that of the pattern 112.

In some embodiments, the overlay mark 110 can be utilized to generate a first overlay error, measuring the misalignment of the current layer and the pre-layer by measuring the positions of the patterns 121a and 122. In some embodiments, the first overlay error can be abnormal due to misalignment of the current layer and the pre-layer. In some embodiments, the first overlay error is abnormal due to reasons other than misalignment of the current layer and the pre-layer. For example, wafer warpage can result in an abnormality in the first overlay error. In such a case, the abnormality in the first overlay error is not caused by the misalignment of the current layer and the pre-layer, and if exposure equipment is adjusted only based on the first overlay error, the adjusted exposure equipment will cause the next wafer to be misaligned due to the inaccurate or inappropriate adjustment.

The overlay mark 120a can be utilized to generate a second overlay error. In some embodiments, the overlay mark 120a can be used to correct the first overlay error based on the second overlay error. In some embodiments, the overlay mark 120a can be utilized to determine whether the abnormality in the first overlay is caused by wafer warpage rather than by misalignment of the current layer and the pre-layer. If no warpage occurs, the optical images of the pattern 121a will be superimposed on that of the pattern 122. When wafer warpage occurs, a shift will be generated between the patterns 121a and 122. In some embodiments, the second overlay error can increase with the degree of warpage. Therefore, the second overlay error can be regarded as an index to estimate wafer warpage. In some embodiments, when the second overlay error exceeds a predetermined value, it can be determined that the abnormality in the first overlay error is caused by warpage issue rather than misalignment. As a result, the exposure equipment can be free from inaccurate adjustment of the first overlay error and the second overlay error. Further, both the first overlay error and the second overlay error can be obtained by overlay measurement equipment. In this embodiment, transfer of the wafer, of which the first overlay error is abnormal, into warpage measurement equipment, such as patterned wafer geometry (PWG) metrology, is not required, thereby improving the cycle time of manufacturing a semiconductor device structure.

Figure 5:
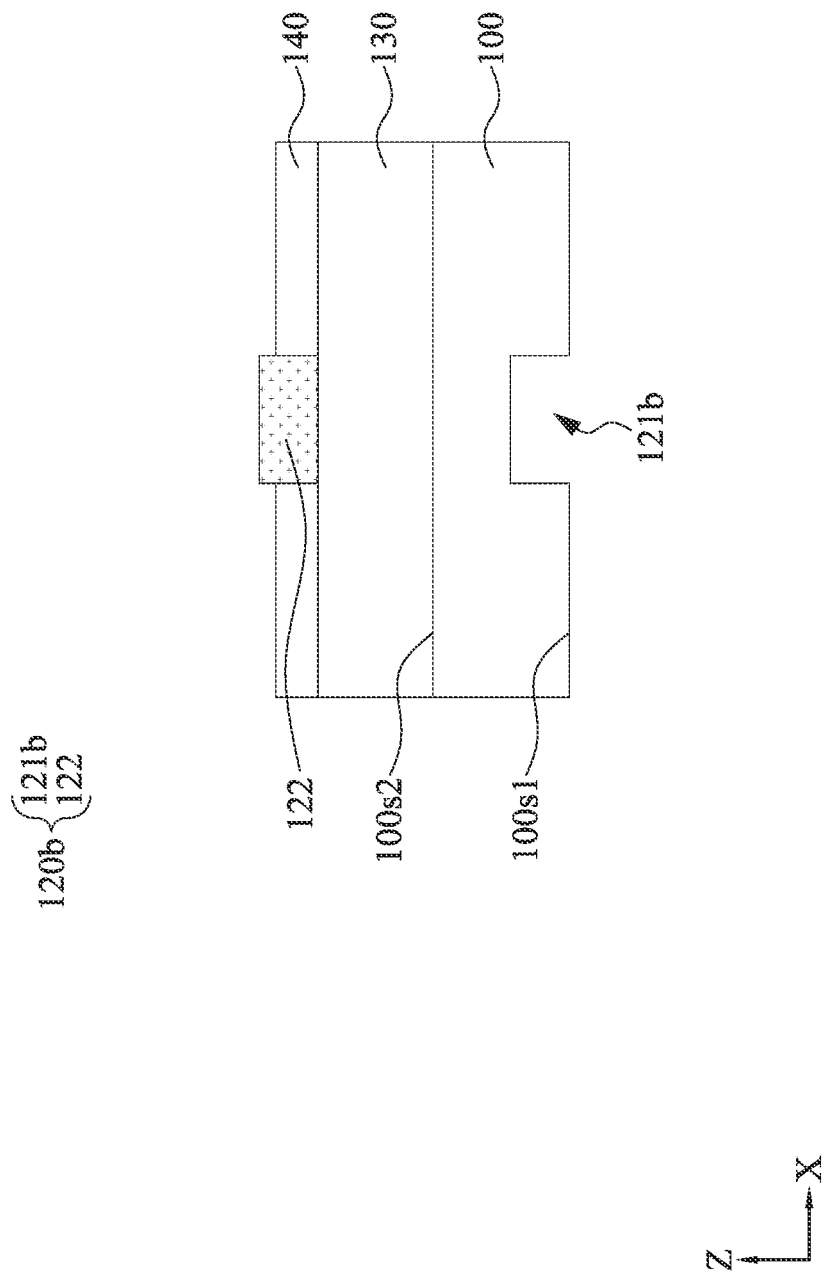
FIG. 5 is a cross-sectional view of an overlay mark, in accordance with some embodiments of the present disclosure.

FIG. 5 is a cross-sectional view of an overlay mark 120b, in accordance with some embodiments of the present disclosure. The overlay mark 120b shown in FIG. 5 can be similar to the overlay mark 120a shown in FIG. 4A, differing in that the overlay mark 120b can include a pattern 121b.

In some embodiments, the pattern 121b can be defined by a recess in the surface 100s1 of the substrate 100. In some embodiments, etching can be performed on the surface 100s1 of the substrate 100 to form the pattern 121b. In some embodiments, the recess in the substrate 100 can be filled with other materials, such as dielectric material or conductive material.

In this embodiment, the overlay mark 120b can be utilized to determine whether the abnormality in the first overlay is caused by wafer warpage rather than by the misalignment of the current layer and the pre-layer. As a result, the exposure equipment can be free from inaccurate or inappropriate adjustment by the first overlay error and the second overlay error.

Figure 6:
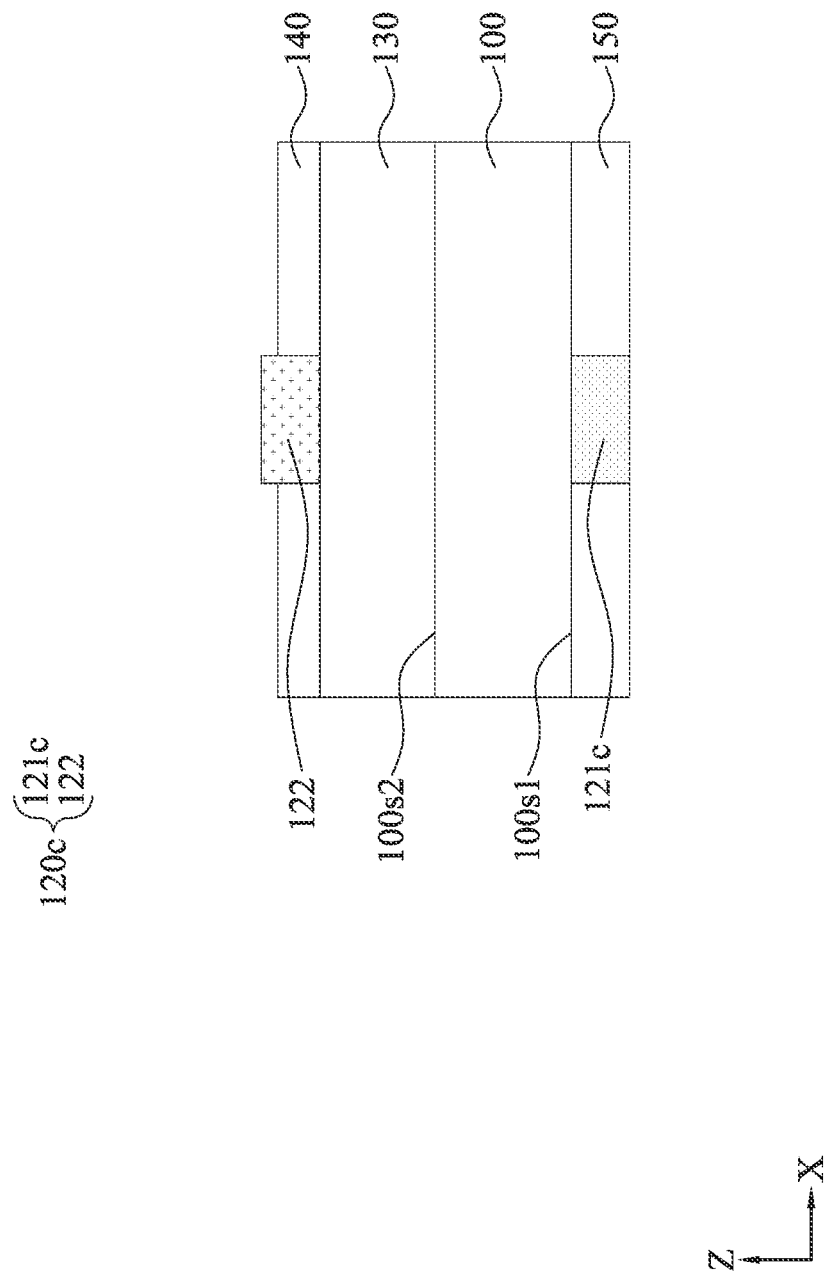
FIG. 6 is a cross-sectional view of an overlay mark, in accordance with some embodiments of the present disclosure.

FIG. 6 is a cross-sectional view of an overlay mark 120c, in accordance with some embodiments of the present disclosure. The overlay mark 120c shown in FIG. 6 can be similar to the overlay mark 120a shown in FIG. 4A, differing in that the overlay mark 120c can include a pattern 121c.

In some embodiments, a dummy layer 150 can be formed on the surface 100s1 of the substrate 100. In some embodiments, the pattern 121c can be defined by a recess in the dummy layer 150. In some embodiments, etching can be performed on the dummy layer 150 to form the pattern 121c. In some embodiments, the recess in the dummy layer 150 can be filled with other materials. In some embodiments, the dummy layer 150 can include a polysilicon layer. In some embodiments, the dummy layer 150 can be metal, such as aluminum (Al), copper (Cu), tungsten (W), titanium (Ti), tantalum (Ta), or other applicable materials. In some embodiments, a portion of the surface 100s1 of the substrate 100 can be exposed by the dummy layer 150. In some embodiments, the recess in the dummy layer 150 can be a blind hole.

In this embodiment, the overlay mark 120c can be utilized to determine whether the abnormality in the first overlay is caused by wafer warpage rather than by the misalignment of the current layer and the pre-layer. As a result, the exposure equipment can be free from inaccurate or inappropriate adjustment by the first overlay error and the second overlay error.

Figure 7:
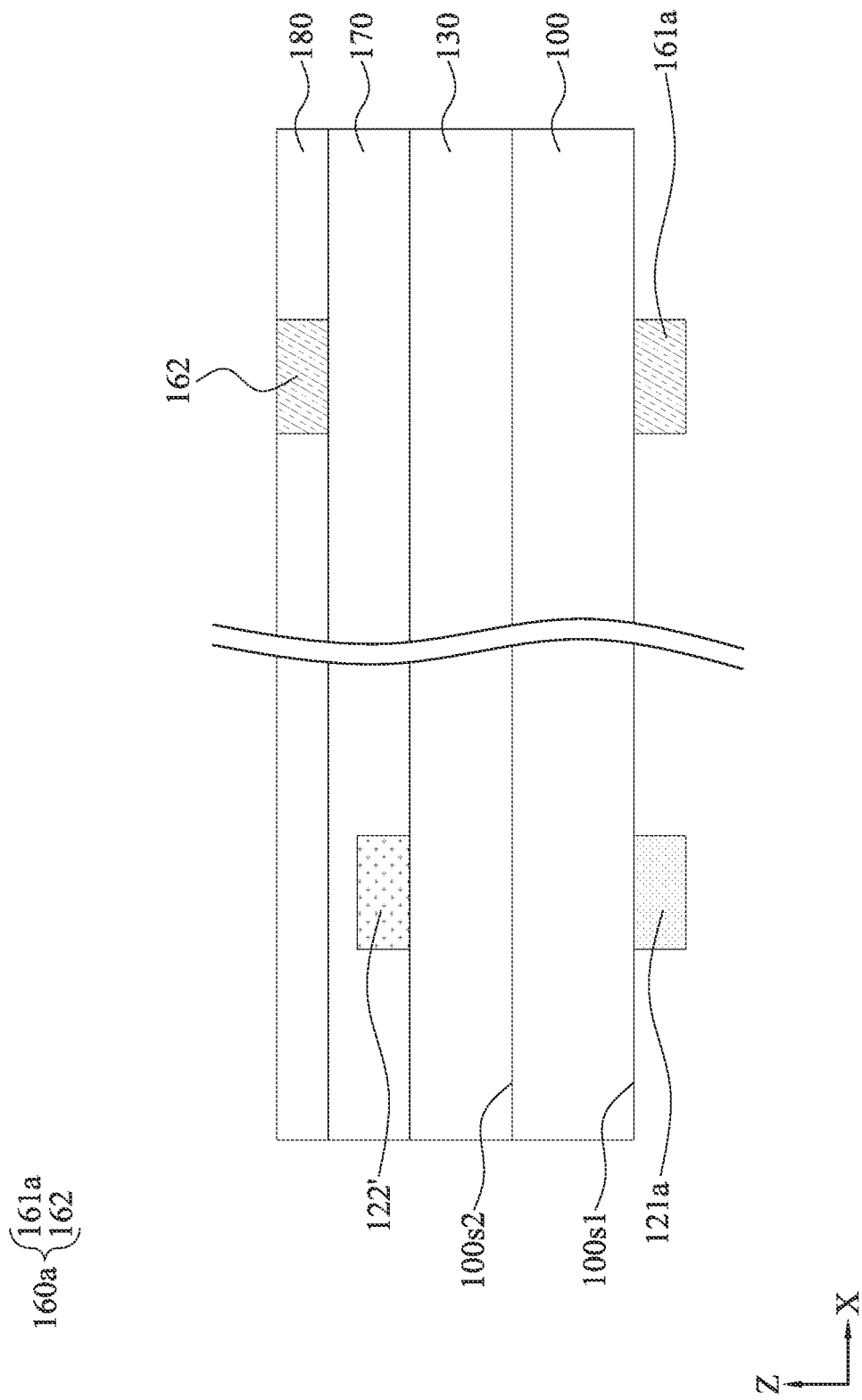
FIG. 7 is a cross-sectional view of an overlay mark, in accordance with some embodiments of the present disclosure.

FIG. 7 is a cross-sectional view of an overlay mark 160, in accordance with some embodiments of the present disclosure. The semiconductor device structure shown in FIG. 7 is similar to that shown in FIG. 4A, differing in that the semiconductor device structure of FIG. 7 can further include the overlay mark 160a.

The overlay mark 160a can be utilized to generate a third overlay error. The overlay mark 160a can be utilized to determine whether an abnormality in the overlay error, generated from another pair of current and pre-layers, is caused by warpage on a wafer. Although not shown, it should be noted that another pair of current and pre-layers can be located on the intermediate structure 170 and within the intermediate structure 170, respectively. The overlay mark 160a can be utilized to determine whether an abnormality in the overlay error is caused by the misalignment of aforesaid current and pre-layers.

The overlay mark 160a can include a pattern 161a and a pattern 162, both of which can be collaboratively utilized to generate a third overlay error. In some embodiments, the pattern 161a can be disposed on the surface 100s1 of the substrate 100. In some embodiments, the pattern 161a and the pattern 121a can be located at the same horizontal level. In some embodiments, the material of the pattern 161a can be the same as that of the pattern 121a and made by the same processes. In some embodiments, the profile of the pattern 161a can be the same as that of the pattern 121a. In some embodiments, the profile of the pattern 161a can be different from that of the pattern 121a. In some embodiments, the pattern 161a can be free from overlapping the pattern 121a in the Z direction.

In some embodiments, the pattern 162 can be disposed on or over the surface 100s2 of the substrate 100. In some embodiments, the pattern 162 can be located at a horizontal level different from that of the pattern 122'. The pattern 162 can be disposed on the intermediate structure 170. The intermediate structure 170 can include one or more dielectric layers and conductive features disposed within the dielectric layers. The intermediate structure 170 can cover the feature 122'. The feature 122' can be formed by filling conductive or dielectric materials into the openings defined by the pattern 122. The feature 122' can have a pattern the same as the pattern 122. In some embodiments, the pattern 162 can be an opening or a recess defined by the mask 180. The mask 180 can be formed on the intermediate structure 170, and will be removed in subsequent processes. The mask 180 can include a positive-tone or negative-tone photoresist. The mask 180 can be used to define a pattern into the intermediate structure 170 such that the portion of the intermediate structure 170 exposed by the photoresist layer can be removed.

In some embodiments, the profile of the pattern 162 and the profile of the pattern 161a are equiform, in a plan view. In some embodiments, the profile of the pattern 161a is symmetrical with the profile of the pattern 162 with respect to the XY plane. In some embodiments, the shape of the pattern 161a and the shape of the pattern 162 are substantially the same. In some embodiments, the size of the pattern 161a and the size of the pattern 162 are substantially the same. In some embodiments, the pattern 161a overlaps at least a portion of the pattern 162 along the Z axis.

In this embodiment, the overlay mark 160a can be used to estimate wafer warpage at a stage different from that at which the overlay mark 120a is utilized to estimate warpage as shown in FIG. 4A.

In this embodiment, the overlay mark 160a can be utilized to determine whether the abnormality in the overlay is caused by wafer warpage rather than by the misalignment of the current layer and the pre-layer.

As a result, the exposure equipment can be free from inaccurate adjustment by the third overlay error.

Figure 8:
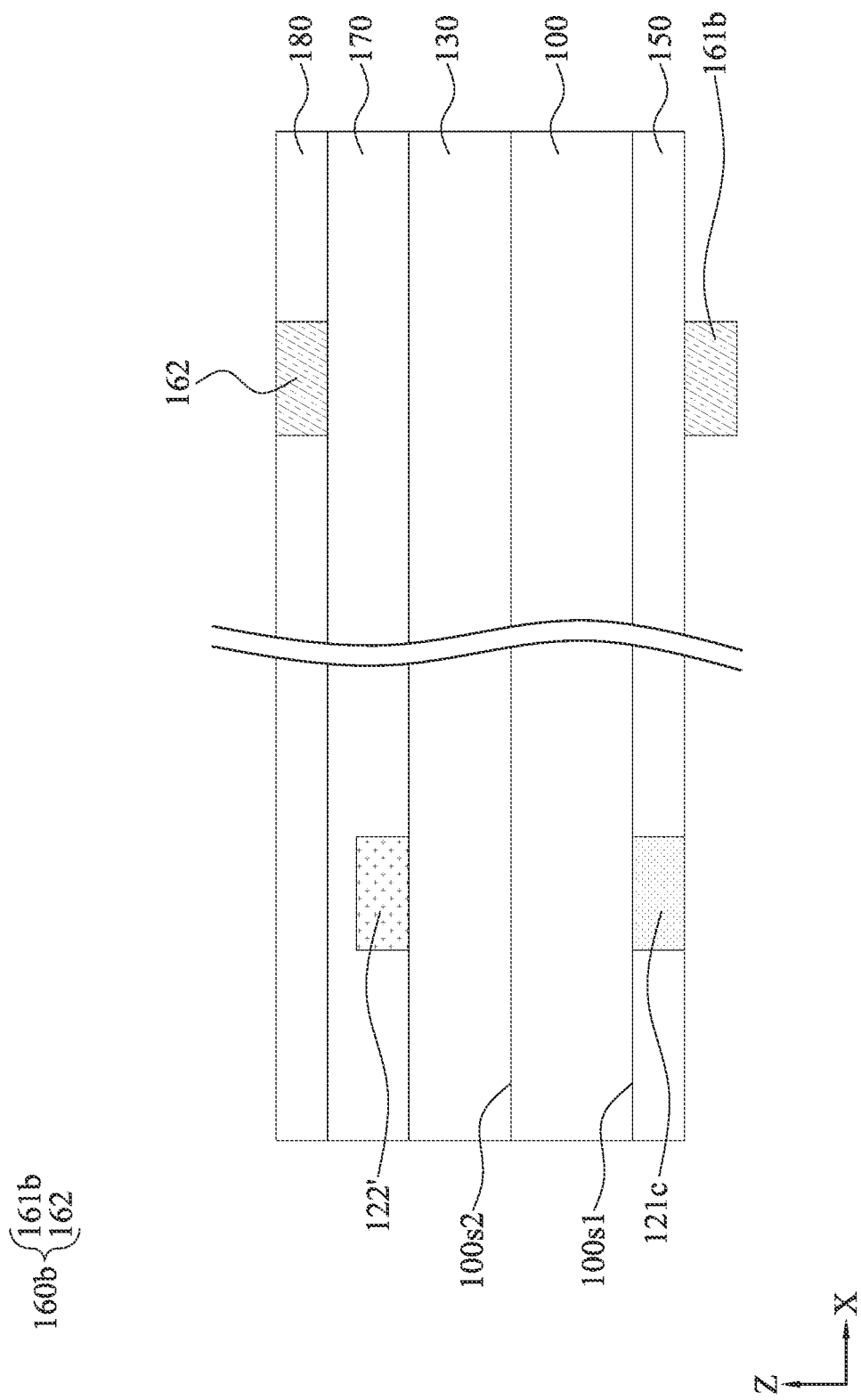
FIG. 8 is a cross-sectional view of an overlay mark, in accordance with some embodiments of the present disclosure.

FIG. 8 is a cross-sectional view of an overlay mark, in accordance with some embodiments of the present disclosure. The semiconductor device structure shown in FIG. 8 can be similar to that shown in FIG. 7, differing in that the semiconductor device structure can further include the overlay mark 160b.

The overlay mark 160b can be utilized to generate a third overlay error. The overlay mark 160b can be utilized to determine whether an abnormality in the overlay error, generated from another pair of current and pre-layers, is caused by warpage on a wafer. The overlay mark 160b can be used to estimate wafer warpage at another stage different from that at which the overlay mark 120a is utilized to estimate warpage as shown in FIG. 4A.

The overlay mark 160b can include a pattern 161b and a pattern 162, both of which can be collaboratively utilized to generate the third overlay error. In some embodiments, the pattern 161b can be disposed on the surface 100s1 of the substrate 100. In some embodiments, the pattern 161b and the pattern 121c can be located at different horizontal levels. In some embodiments, the pattern 121c can be defined by a recess in the dummy layer 150. In some embodiments, the recess in the dummy layer 150 can be filled with other materials, such as dielectric material or conductive material. In some embodiments, the pattern 161b can be another dummy layer or a recess in another dummy layer disposed on the dummy layer 150. For example, the material of the pattern 161b can include a polysilicon layer, a meal layer or an alloy layer, and can be formed by LPCVD. PECVD, sputtering, or other suitable processes.

Although FIG. 8 illustrates the horizontal level of the pattern 161b being lower than that of the pattern 121c, the present disclosure is not intended to be limiting. In other some embodiments, the horizontal level of the pattern 161b can be higher than that of the pattern 121c. In some embodiments, the pattern 161b can be free from overlap with the pattern 121c in the Z direction.

In this embodiment, the overlay mark 160b can be utilized to determine whether the abnormality in the overlay is caused by wafer warpage rather than by the misalignment of the current layer and the pre-layer. As a result, the exposure equipment can be free iiom inaccurate or inappropriate adjustment by the third overlay error.

Figure 9:
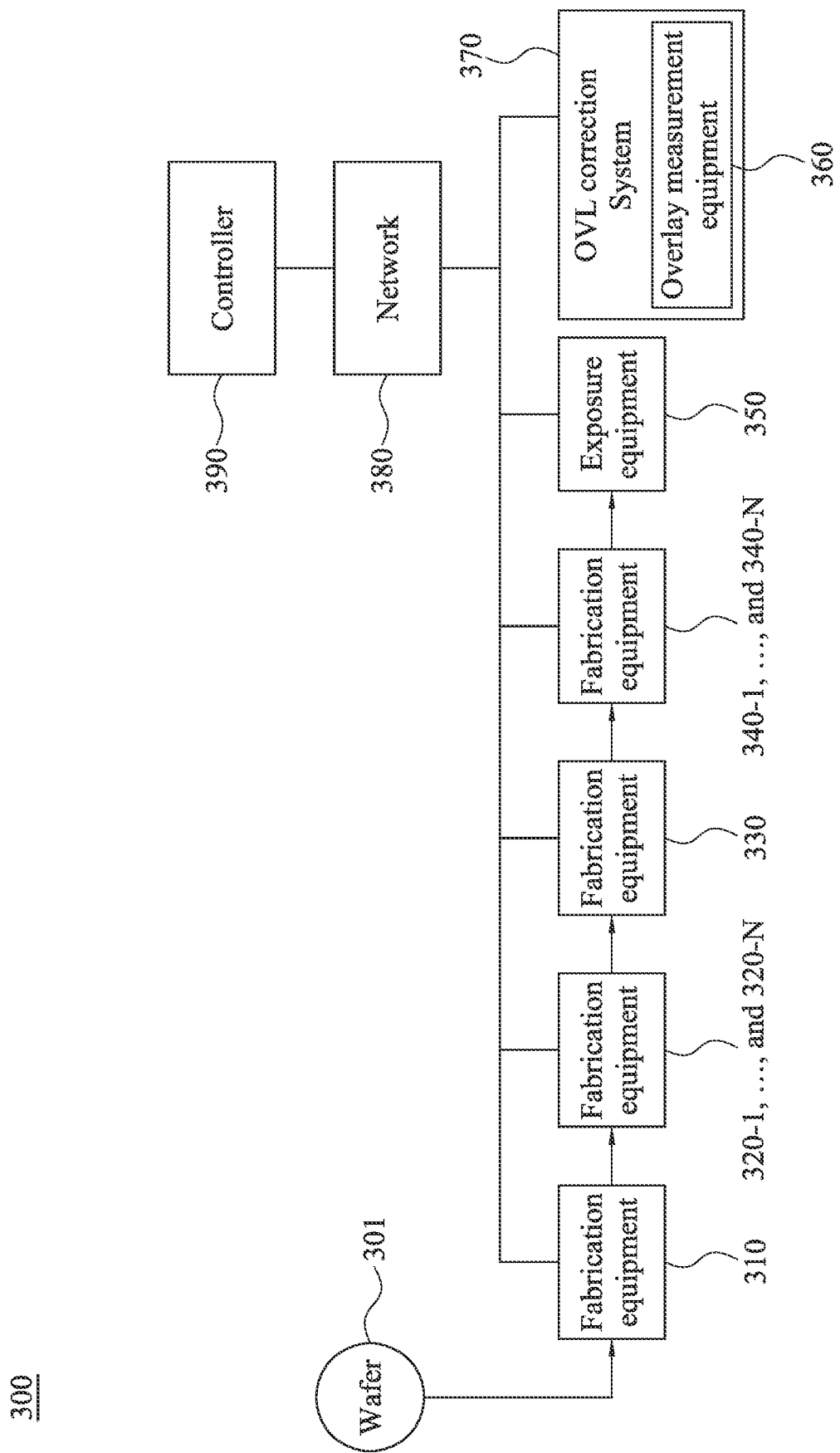
FIG. 9 is a block diagram illustrating a semiconductor fabrication system, in accordance with some embodiments of the present disclosure.

FIG. 9 is a block diagram illustrating a semiconductor fabrication system 300, in accordance with some embodiments of the present disclosure.

The semiconductor fabrication system 300 can include fabrication equipment 310, 320-1, . . . , and 320-N, 330, 340-1, . . . , and 340-N, exposure equipment 350, as well as overlay measurement equipment 360. An overlay correction system 370 can be included or built in the overlay measurement equipment 360. The fabrication equipment 310, 320-1, . . . , and 320-N, 330, 340-1, . . . , and 340-N, exposure equipment 350, as well as overlay measurement equipment 360 can be signally coupled with a controller 390 through a network 380. In some embodiments, the overlay correction system 370 can be an independent system signally coupled to the overlay measurement equipment 360 through the network 380.

The fabrication equipment 310 can be used to form the reference pattern, such as the pattern 121a, 121b, 121c, 160a or 160b as shown in FIG. 4A, FIG. 5, FIG. 6, FIG. 7 or FIG. 8, respectively. The fabrication equipment 310 can be used to form a pattern, as a portion of an overlay mark, on a backside surface of a wafer.

The fabrication equipment 320-1, . . . , and 320-N can be used to form elements or features between the pre-layer, such as the pattern 111 shown in FIG. 3A, and the substrate. Each piece of the fabrication equipment 320-1, . . . , and 320-N can be used to perform a deposition process, an etching process, a chemical mechanical polishing process, photoresist coating process, baking process, an alignment process, or other processes.

The fabrication equipment 330 can be used to form the pattern in a pre-layer, such as the pattern 111 shown in FIG. 5. In some embodiments, the fabrication equipment 330 may be used to form an isolation structure, a gate structure, a conductive via or other layers.

The pattern of the pre-layer may include dielectric material, semiconductor material or conductive material.

The fabrication equipment 340-1, . . . , and 340-N can be used to form an intermediate structure, such as the intermediate structure 130 shown in FIG. 4A. Each piece of the fabrication equipment 340-1, . . . , and 340-N can be used to perform a deposition process, an etching process, a chemical mechanical polishing process, photoresist coating process, baking process, an alignment process, or other processes.

The exposure equipment 350 can be used to form the pattern of a current layer, such as the patterns 112 and 122 shown in FIG. 3B and FIG. 4A, respectively.

In some embodiments, the overlay measurement equipment 360 can be used to obtain optical images of the patterns of the pre-layer and the current layer, and to generate a first overlay error based on the aforesaid optical images of the patterns of the pre-layer and the current layer (e.g., patterns 111 and 112). In some embodiments, the overlay measurement equipment 360 can be utilized to generate a second overlay error based on the reference pattern and the pattern in the current layer (e.g., patterns 121 and 122).

The overlay correction system 370 can include correction parameters used to generate corrected first and second overlay errors.

The overlay correction system 370 can include, for example, a calculator or a server. In some embodiments, each of the corrected first and second overlay errors can be generated or calculated by program codes or program languages. For example, the corrected first overlay error can be determined by the first overlay error obtained from the overlay measurement equipment 360 and the correction parameters of the overlay correction system 370. In some embodiments, an X-directional deviation ($\Delta X$), Y-directional deviation ($\Delta Y$), or the combination of both, can be generated from the correction parameters. Each of the X-directional deviation ($\Delta X$), the Y-directional deviation ($\Delta Y$), or the combination of both can be represented by formulae involving the correction parameters as variables. In some embodiments, the overlay correction system 370 can receive the information of optical images from the pre-layer's pattern (or the reference pattern) and the current layer's pattern, and then generate the X-directional deviation ($\Delta X$), Y-directional deviation ($\Delta Y$), or combination of both to compensate the first and second overlay errors obtained from the overlay measurement equipment 360.

The network 380 can be the internet or an intranet implementing network protocols such as transmission control protocol (TCP). Through the network 380, each piece of fabrication equipment 310, 320-1, . . . , and 320-N, 330, 340-1, . . . , and 340-N, exposure equipment 350, as well as overlay measurement equipment 360 may download or upload work in progress (WIP) information regarding to the wafer or the fabrication equipment firom or to the controller 390.

The controller 390 can include a processor, such as a central processing unit (CPU). In some embodiments, the controller 390 can be utilized to generate an instruction whether to adjust the exposure equipment 350 based on the first overlay error and the second overlay error.

Although FIG. 9 does not show any other fabrication equipment before the fabrication equipment 310, the exemplary embodiment is not intended to be limiting. In other exemplary embodiments, various kinds of fabrication equipment can be scheduled before the fabrication equipment 310, and can be used to perform various processes according to the design requirement.

In the exemplary embodiments, a wafer 301 is transferred to the fabrication equipment 310 to start a sequence of different processes. The wafer 301 may be processed by various stages forming at least one layer of material. The exemplary embodiments are not intended to limit the progress of the wafer 301. In other exemplary embodiments, the wafer 301 may include various layers, or any stages between the beginning and the completion of a product, before the wafer 301 is transferred to the fabrication equipment 310. In the exemplary embodiments, the wafer 301 can be processed by the fabrication equipment 310, 320-1, . . . , and 320-N, 330, 340-1, . . . , and 340-N, exposure equipment 350, as well as overlay measurement equipment 360 in a sequential order.

Figure 10:
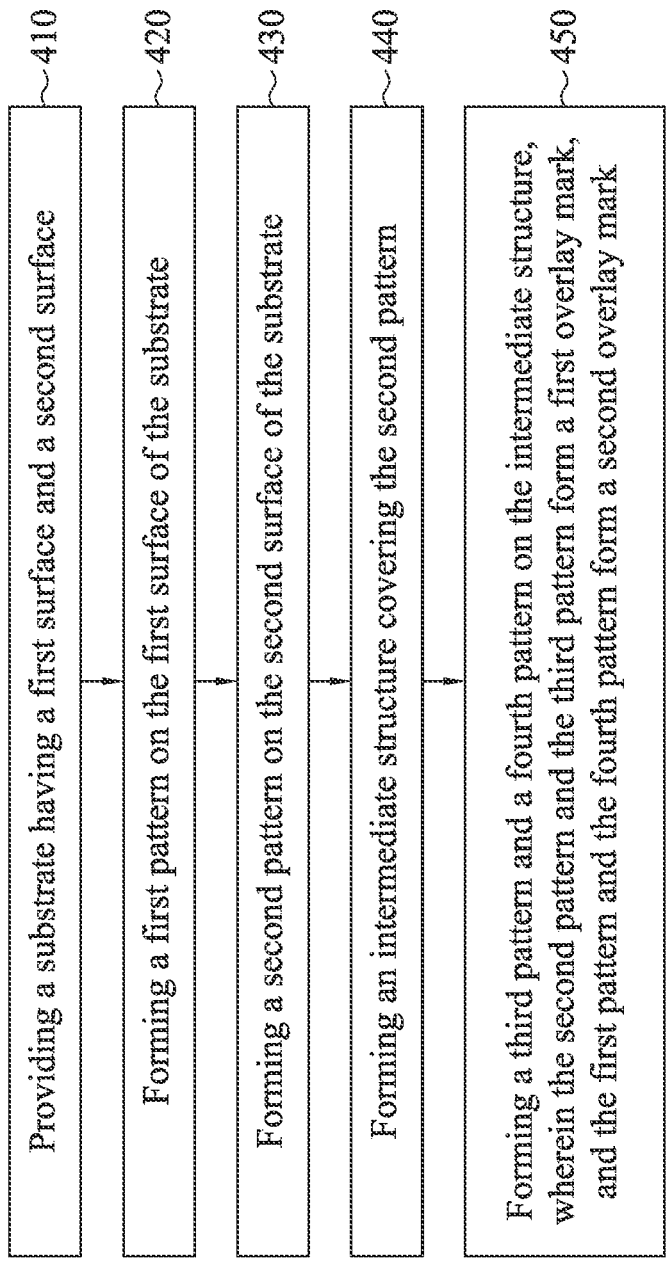
FIG. 10 is a flow chart illustrating a method for manufacturing overlay marks, in accordance with various aspects of the present disclosure.

FIG. 10 is a flowchart of a method 400 for manufacturing a semiconductor device structure, in accordance with various aspects of the present disclosure.

The method 400 begins with operation 410 in which a substrate is provided. The substrate can have a first surface and a second surface opposite to the first surface. The first surface can also be referred to as a backside surface. The second surface can also be referred to as an active surface, on which active features, such as gate structures or traces connected to input/output terminals, are formed.

The method 400 continues with operation 420 in which a first pattern is formed on the first surface of the substrate. In some embodiments, the first pattern can be a polysilicon layer on the first surface of the substrate. In some embodiments, the first pattern can be a recess in the first surface of the substrate. In some embodiments, the first pattern can be a recess in a polysilicon layer formed on the first surface of the substrate. In some embodiments, the method 400 can include forming a polysilicon layer on the first surface of the substrate, and then patterning the polysilicon layer to form the first pattern. In some embodiments, the remaining portion of the polysilicon layer can be used to define the first pattern. In some embodiments, a recess or an opening of the polysilicon layer can be used to define the first pattern. In some embodiments, the method 400 can include removing a portion of the substrate from the first surface of the substrate to form a recess serving as the first pattern. The first pattern can be formed by, for example, the fabrication equipment 310 shown in FIG. 9.

The method 400 continues with operation 430 in which a second pattern is formed on the second surface of the substrate. The second pattern can include a material the same as that of the isolation features, gate structures, or conductive vias. The second pattern can be formed by processes utilized to form isolation features, gate structures, or conductive vias. The second pattern can be formed by, for example, the fabrication equipment 330 shown in FIG. 9.

The method 400 continues with operation 440 in which an intermediate structure is formed to cover the second pattern. The intermediate structure can include one or more intermediate layers made of insulating material, such as silicon oxide or silicon nitride. The intermediate structure can include conductive features formed in the dielectric layers. In some embodiments, the intermediate structure can be formed by CVD, PVG, ALD, dry etching, wet etching. CMP, photolithography processes. The intermediate structure can be formed by, for example, the fabrication equipment 340-1, . . . , and 340-N shown in FIG. 9.

The method 400 continues with operation 450 in which a third pattern is formed to vertically align with the second pattern, and a fourth pattern is formed to vertically align with the first pattern. In some embodiments, the third pattern and the fourth pattern can be openings of a mask, such as a photoresist layer. In some embodiments, the operation 450 can include, for example, forming a photoresist layer over the intermediate structure, exposing the photoresist layer to a pattern by a reticle, baking and developing the photoresist to form the mask third pattern and the fourth pattern. The third pattern and the fourth pattern can be formed by at least the exposure equipment 350 shown in FIG. 9.

The second pattern and the third pattern can be collaboratively utilized to generate a first overlay error measuring the shift between the pre-layer and the current layer. The first pattern and the fourth pattern can be collaboratively utilized to generate a second overlay error to determine whether an abnormality in the first overlay error is caused by the misalignment of the pre-layer and the current layer. The first pattern, second pattern, third pattern, and fourth pattern can be collaboratively utilized to measure a degree of wafer warpage.

Figure 11:
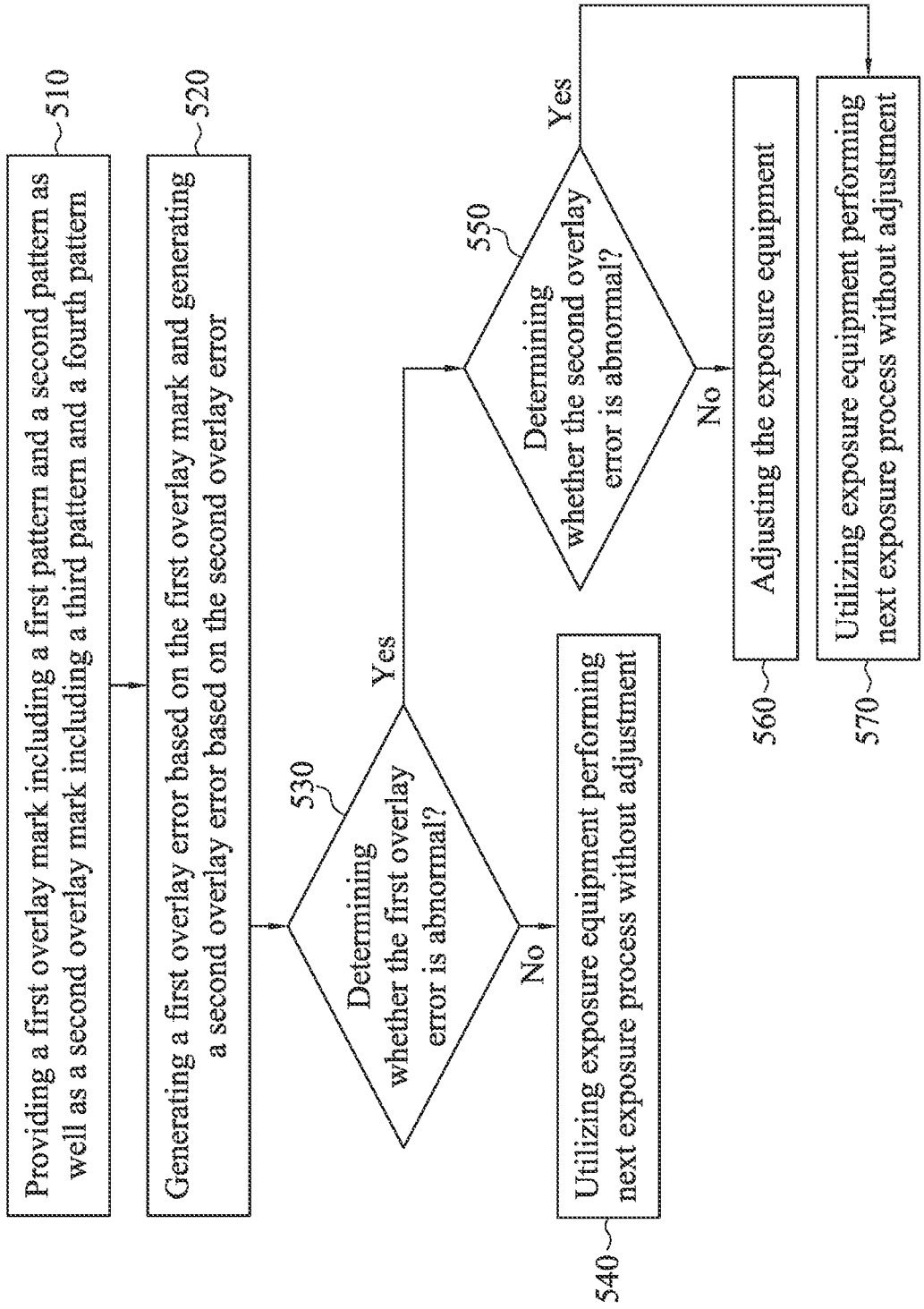
FIG. 11 is a flow chart illustrating a method for overlay error correction, in accordance with various aspects of the present disclosure.

FIG. 11 is a flow chart illustrating a method 500 for overlay correction, in accordance with various aspects of the present disclosure.

The method begins with operation 510 in which a first overlay mark and a second overlay mark are provided. The first overlay mark can include the overlay mark 110 shown in FIG. 3, which can include a first pattern (e.g., pattern 111) ofa pre-layer and a second pattern (e.g., pattern 112) of a current layer. The second overlay mark can include the overlay mark 120 shown in FIG. 4. The second overlay mark can include a third pattern (e.g., pattern 121) and a fourth pattern (e.g., pattern 122) of the current layer. In some embodiments, the second pattern and the fourth pattern can be formed by exposure equipment (e.g., exposure equipment 350).

The method continues with operation 520 in which a first overlay error is generated based on the first overlay mark, and a second overlay error is based on the second overlay mark. In some embodiments, optical image(s) can be obtained from overlay measurement equipment (e.g., the overlay measurement equipment 360). The overlay errors can be generated based on the optical image(s). The first overlay error can be calculated based on the first pattern and the second pattern. The second overlay error can be calculated based on the third pattern and the fourth pattern. In some embodiments, the operation 520 can further include correction of the first overlay error and the second overlay error by an overlay correction system (e.g., overlay system 370).

The method continues with operation 530 in which a first determination is performed to determine whether the first overlay error is abnormal. In some embodiments, the overlay measurement equipment can send a signal of the first overlay error to a controller (e.g., controller 390) through a network (e.g., network 380), and the controller can compare the first overlay error and a target first overlay error. In some embodiments, a target first overlay error can be predetermined based on a requirement of the semiconductor fabrication process. In some embodiments, the controller can include a determination module (not shown) to perform the operation 530. In some embodiments, when the first overlay error exceeds the target first overlay error, it can be determined that the first overlay error is abnormal.

Next, based on the first determination of operation 530, operation 540 or operation 550 is performed. In some embodiments, when the first overlay error is not abnormal, the exposure equipment can be utilized to perform next exposure process without adjusting the exposure equipment, as shown in operation 540.

In some embodiments, when the first overlay error is abnormal, a second determination is performed to determine whether the second overlay error is abnormal, as shown in operation 550. In some embodiments, the overlay measurement equipment can send a signal of the second overlay error to the controller, and then the controller can compare the second overlay error and a target second overlay error. In some embodiments, a target second overlay error can be predetermined based on a requirement of the semiconductor fabrication process. In some embodiments, the determination module of the controller can perform the operation 550. In some embodiments, when the second overlay error exceeds the target second overlay error, it can be determined that the second overlay error is abnormal.

Next, based on the determination of operation 550, operation 560 or operation 570 is performed. In some embodiments, when the second overlay error is not abnormal, it can be determined that wafer warpage does not cause the abnormality in the first overlay error. In such a case, the exposure equipment can be adjusted, and then can be utilized to perform next exposure process, as shown in operation 560.

In some embodiments, when the second overlay error is abnormal, it can be determined that wafer warpage results in the abnormality in the first overlay error. The exposure equipment can be utilized to perform next exposure process without adjusting the exposure equipment, as shown in operation 570.

In some embodiments, the abnormality in the first overlay error is not caused by the misalignment of the pre-layer and the current layer, but by wafer warpage. If the exposure equipment is adjusted only based on the first overlay error, the next wafer will suffer misalignment of the current layer and the pre-layer by inaccurate adjustment of the exposure equipment. To avoid such a situation, the second overlay error can be utilized to determine whether the abnormality in the first overlay error is caused by wafer warpage rather than a misalignment of the pre-layer and the current layer. By two steps of determinations of two overlay marks, an inaccurate adjustment of exposure equipment can be prevented. Accordingly, the available time of the exposure equipment can thus be enhanced.

Figure 12:
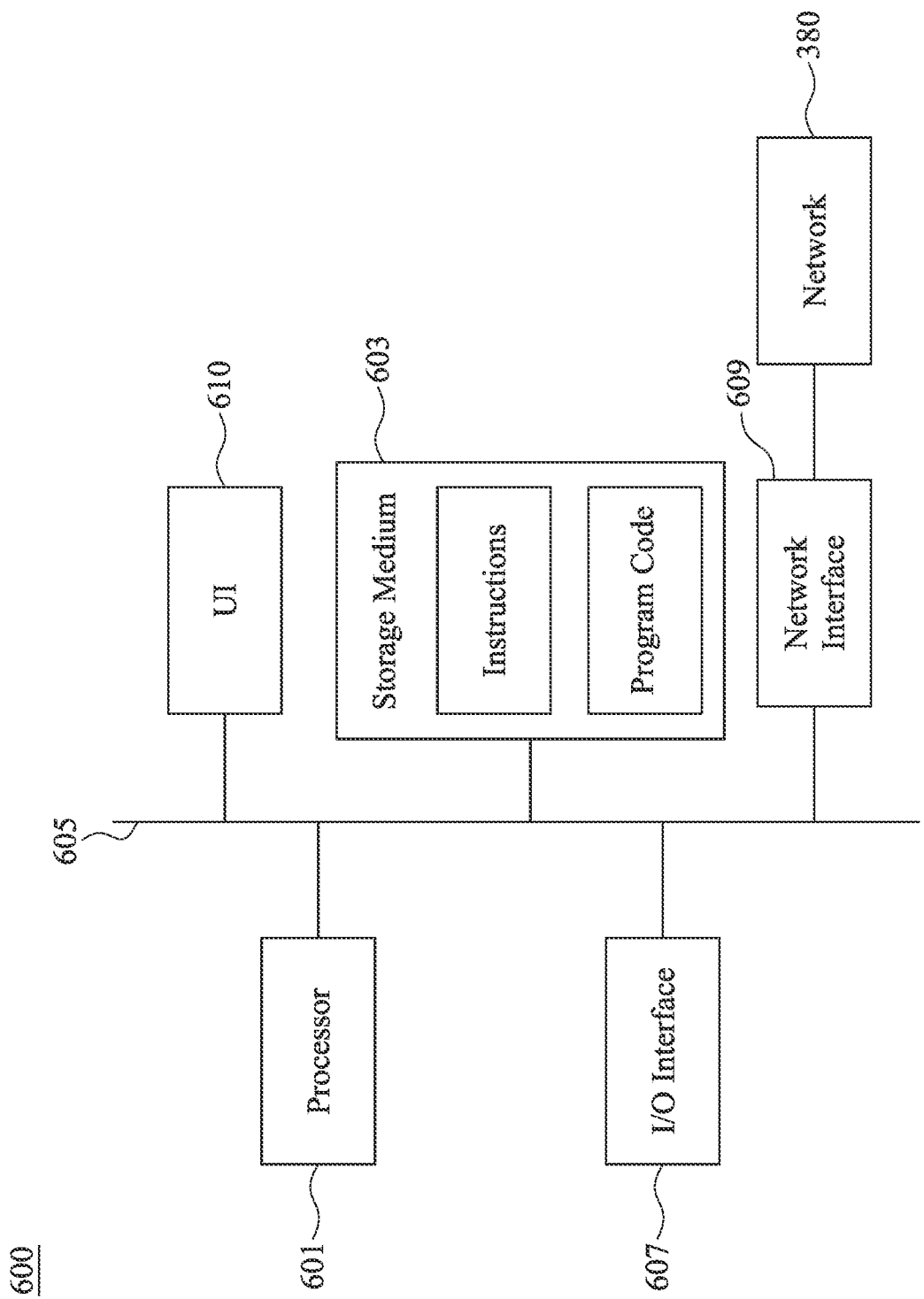
FIG. 12 is a diagram illustrating hardware of a semiconductor fabrication system, in accordance with various aspects of the present disclosure.

The processes illustrated in FIG. 10 and FIG. 1I may be implemented in the controller 390, or a computing system that organizes the fabrication of wafe-r by controlling every or a portion of fabrication equipment in the facility. FIG. 12 is a diagram illustrating hardware of a semiconductor fabrication system 600, in accordance with various aspects of the present disclosure. The system 600 includes one or more hardware processors 601 and a non-transitory computer readable storage medium 603 encoded with, i.e., storing, the program codes (i.e., a set of executable instructions.) The computer readable storage medium 603 may also be encoded with instructions for interfacing with fabrication equipment for producing the semiconductor device. The processor 601 is electrically coupled to the computer readable storage medium 603 via a bus 605. The processor 601 is also electrically coupled to an I/O interface 607 by the bus 605. A network interface 609 is also electrically connected to the processor 601 via the bus 605. The network interface is connected to a network, so that the processor 601 and the computer readable storage medium 603 are capable of connecting to external elements via network 380.

The processor 601 is configured to execute the computer program code encoded in the computer readable storage medium 605 in order to cause the system 600 to be usable for performing a portion or all of the operations as described in the methods illustrated in FIG. 10 and FIG. 11.

In some exemplary embodiments, the processor 601 is, but not limited to, a central processing unit (CPU), a multi-processor, a distributed processing system, an application specific integrated circuit (ASIC), and/or a suitable processing unit. Various circuits or units are within the contemplated scope of the present disclosure.

In some exemplary embodiments, the computer readable storage medium 603 is, but not limited to, an electronic, magnetic, optical, electromagnetic, infrared, and/or a semiconductor system (or apparatus or device). For example, the computer readable storage medium 603 includes a semiconductor or solid-state memory, a magnetic tape, a removable computer diskette, a random access memory (RAM), a read-only memory (ROM), a rigid magnetic disk, and/or an optical disk. In one or more exemplary embodiments using optical disks, the computer readable storage medium 603 also includes a compact disk-read only memory (CD-ROM), a compact disk-read/write (CD-R/W), and/or a digital video disc (DVD).

In some exemplary embodiments, the storage medium 603 stores the computer program code configured to cause system 600 to perform methods illustrated in FIG. 10 and FIG. 11. In one or more exemplary embodiments, the storage medium 601 also stores information needed for performing the methods illustrated in FIG. 10 and FIG. 11 as well as information generated during performing the methods and/or a set of executable instructions to perform the operation of methods illustrated in FIG. 10 and FIG. 11. In some exemplary embodiments, a user interface 610, e.g., a graphical user interface (GUI), may be provided for a user to operate on the system 600.

In some exemplary embodiments, the storage medium 603 stores instructions for interfacing with external machines. The instructions enable processor 601 to generate instructions readable by the external machines to effectively implement the methods illustrated in FIG. 10 and FIG. 11 during an analysis.

System 600 includes input and output (I/O) interface 607. The I/O interface 607 is coupled to external circuitry. In some exemplary embodiments, the I/O interface 607 can include, but not limited to, a keyboard, keypad, mouse, trackball, track-pad, touch screen, and/or cursor direction keys for communicating information and commands to processor 601.

In some exemplary embodiments, the I/O interface 607 can include a display, such as a cathode ray tube (CRT), liquid crystal display (LCD), a speaker, and so on. For example, the display shows information.

System 600 can also include a network interface 609 coupled to the processor 601. The network interface 609 allows system 600 to communicate with network 380, to which one or more other computer systems are connected. For example, the system 600 may be connected to the fabrication equipment 310, 320-1, . . . , and 320-N, 330, 340-1, . . . and 340-N, exposure equipment 350, as well as overlay measurement equipment 360 through the network interface 609 connecting to the network 380.

One aspect of the present disclosure provides a mark for overlay correction. The mark includes a first pattern and a second pattern. The first pattern is disposed on a first surface of a substrate. The second pattern is disposed on a second surface of the substrate. The second surface of the substrate is opposite to the first surface of the substrate. The first pattern overlaps at least a portion of the second pattern, and the first pattern and the second pattern collaboratively define a first overlay error.

Another aspect of the present disclosure provides a mark for overlay correction. The mark includes a first overlay mark and a second overlay mark. The first overlay mark includes a first pattern and a second pattern disposed on a first surface of a substrate. The first overlay mark is utilized to generate a first overlay error. The second overlay mark includes a third pattern disposed on a second surface of the substrate and a fourth pattern disposed on the first surface of the substrate. The first surface of the substrate is opposite to the second surface of the substrate. The second overlay mark is utilized to generate a second overlay error, and the second overlay mark is utilized to correct the first overlay error.

Another aspect of the present disclosure provides a method for overlay error correction. The method includes: generating a first overlay error based on a first overlay mark, wherein the first overlay error is indicative of a misalignment of a lower pattern and an upper pattern of the first overlay mark; and in response to an abnormality in the first overlay error is detected: generating a second overlay error based on a second overlay mark; and determining whether the abnormality in the first overlay error is caused by the misalignment of the lower pattern and the upper pattern depending on the second overlay error.

Another aspect of the present disclosure provides a method for manufacturing a semiconductor device structure. The method includes: providing a substrate having a first surface and a second surface opposite to the first surface; forming a first pattern on the first surface of the substrate; forming a second pattern on the second surface of the substrate; forming an intermediate structure covering the second pattern; forming a third pattern on the second surface of the substrate, wherein the second pattern and the third pattern collaboratively define a first overlay error; and forming a fourth pattern on the second surface of the substrate, wherein the first pattern and the fourth pattern collaboratively define a second overlay error.

The embodiments of the present disclosure overlay marks for overlay error measurement. Two overlay marks can be collaboratively utilized to determine whether an abnormality in an overlay error is caused by the misalignment of a current layer and a pre-layer, or caused by wafer warpage. By two steps of determinations of two overlay marks, an inaccurate adjustment of exposure equipment can be prevented. Accordingly, the available time of the exposure equipment can thus be enhanced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for overlay error correction, comprising:
    generating a first overlay error based on a first overlay mark, wherein the first overlay error is indicative of a misalignment between a lower pattern and an upper pattern of the first overlay mark; and
    in response to an abnormal of the first overlay error is detected:
        generating a second overlay error based on a second overlay mark; and
        determining whether the abnormal of the first overlay error is caused by the misalignment between the lower pattern and the upper pattern depending on the second overlay error.

2. The method of claim 1, wherein the second overlay mark comprises a first pattern disposed on a first surface of a substrate and a second pattern disposed on a second surface of the substrate, and wherein the first surface of the substrate is opposite to the second surface of the substrate.

3. The method of claim 2, wherein the second pattern is located at a horizontal the same as that of the upper pattern.

4. The method of claim 2, wherein the second pattern overlaps at least the first pattern.

5. The method of claim 2, wherein a profile of the first pattern and a profile of the second pattern are equiform in a plan view.

6. The method of claim 2, wherein the lower pattern is free from overlapping the upper pattern.

7. The method of claim 1, further comprising:
    determining whether the second overlay error is abnormal, and upon determining whether the lower pattern is misaligned to the upper pattern.

8. The method of claim 1, wherein the first overlay error and the second overlay error are collaboratively utilized to determine whether the abnormal of the first overlay error is caused by a warpage of a wafer.

9. A method for manufacturing a semiconductor device structure, comprising:
    providing a substrate having a first surface and a second surface opposite to the first surface;
    forming a first pattern on the first surface of the substrate;
    forming a second pattern on the second surface of the substrate;
    forming an intermediate structure covering the second pattern;
    forming a third pattern on the second surface of the substrate, wherein the second pattern and the third pattern are collaboratively utilized to define a first overlay error; and
    forming a fourth pattern on the second surface of the substrate, wherein the first pattern and the fourth pattern are collaboratively utilized to define a second overlay error.

10. The method of claim 9, wherein a profile of the first pattern and a profile of the fourth pattern are equiform.

11. The method of claim 9, wherein forming the first pattern comprises:
    forming a layer on the first surface of the substrate; and
    patterning the layer to form the first pattern.

12. The method of claim 9, wherein forming the first pattern comprises:
    removing a portion of the substrate to form a recess recessed from the first surface of the substrate, wherein the recess serves as the first pattern.

13. The method of claim 9, wherein forming the first pattern comprises:
    forming a layer on the first surface of the substrate; and
    removing a portion of the layer to form a recess, wherein the recess serves the first pattern.

* * * * *